United States Patent
Singh

(10) Patent No.: US 11,674,855 B2
(45) Date of Patent: Jun. 13, 2023

(54) TEMPERATURE-TO-DIGITAL CONVERTER

(71) Applicant: NXP B.V., Eindhoven (NL)

(72) Inventor: Kamlesh Singh, Bengaluru (IN)

(73) Assignee: NXP B.V., Eindhoven (NL)

( * ) Notice: Subject to any disclaimer, the term of this patent is extended or adjusted under 35 U.S.C. 154(b) by 471 days.

(21) Appl. No.: 17/019,798

(22) Filed: Sep. 14, 2020

(65) Prior Publication Data

US 2022/0082450 A1    Mar. 17, 2022

(51) Int. Cl.
*G01K 7/01* (2006.01)
*H03M 1/06* (2006.01)

(52) U.S. Cl.
CPC ............ *G01K 7/01* (2013.01); *H03M 1/0604* (2013.01); *G01K 2219/00* (2013.01)

(58) Field of Classification Search
CPC .... G01K 7/01; G01K 2219/00; H03M 1/0604
See application file for complete search history.

(56) References Cited

U.S. PATENT DOCUMENTS 7,686,508 B2    3/2010  Lin et al.
2022/0120620 A1*  4/2022  Lee ........................ G01K 1/14

FOREIGN PATENT DOCUMENTS

CN    103837253 A  *  6/2014
CN    111351589 A  *  6/2020 ............... G01K 7/01

OTHER PUBLICATIONS

Aita, A., L. et al. "A CMOS Smart Temperature Sensor with a Batch-Calibrated Inaccuracy of ±0.25° C. (3σ) from -70° C to 130°C.", ISSCC 2009 / Session 20 / Sensors and Mems / 20.2, IEEE International Solid-State Circuits Conference, pp. 342-344 (2009).

* cited by examiner

*Primary Examiner* — Mirellys Jagan

(57) ABSTRACT

A temperature-to-digital converter includes a temperature sensor circuit, an analog-to-digital converter (ADC), and a digital processing circuit. The temperature sensor circuit is configured to generate first and second complementary-to-absolute-temperature (CTAT) voltages based on a sensed absolute temperature. The ADC is configured to receive the first and second CTAT voltages. Further, during first and second conversion cycles of the ADC, the ADC is configured to receive the first and second CTAT voltages, and generate first and second digital voltages, respectively. The first and second digital voltages are generated based on the first and second CTAT voltages, respectively, and a difference between the first and second CTAT voltages. The digital processing circuit is configured to generate, based on the first and second digital voltages, a temperature output voltage that is independent of a gain of the ADC and a digital representation of the absolute temperature.

20 Claims, 4 Drawing Sheets

TEMPERATURE-TO-DIGITAL CONVERTER

BACKGROUND

The present disclosure relates generally to electronic circuits, and, more particularly, to temperature-to-digital converters.

A system-on-chip (SoC) typically includes one or more temperature-to-digital converters that sense a temperature associated with the SoC and generate a digital representation of the sensed temperature. The temperature-to-digital converter includes a temperature sensor circuit and an analog-to-digital converter (ADC). The temperature sensor circuit senses the temperature and generates an analog signal corresponding to the sensed temperature, and the ADC converts the analog signal to a digital signal. The digital signal may then be processed to generate the digital representation of the sensed temperature. The ADC requires a reference signal to convert the analog signal to the digital signal. Typically, a bandgap circuit of the SoC generates and provides the reference signal to the ADC. However, an error in analog circuitry of the bandgap circuit may introduce an error in the digital representation of the sensed temperature.

Conventionally, to overcome the aforementioned problem, the temperature-to-digital converter utilizes an internal reference signal (such as a complementary-to-absolute-temperature voltage) generated by the temperature sensor circuit as the reference signal for the ADC. Such a temperature-to-digital converter is referred to as a self-referenced temperature-to-digital converter. However, an output of the self-referenced temperature-to-digital converter includes an ADC gain error that is introduced therein as a result of variation in a gain of the ADC that arises due to process variation and device mismatch. A one-point temperature trim technique utilized in the self-referenced temperature-to-digital converter fails to correct such ADC gain error. Thus, there is a need for a technical solution that solves the aforementioned problems of the conventional self-referenced temperature-to-digital converter.

SUMMARY

In one embodiment, a temperature-to-digital converter of a system-on-chip (SoC) is disclosed. The temperature-to-digital converter includes a temperature sensor circuit, an analog-to-digital converter (ADC), and a digital processing circuit. The temperature sensor circuit is configured to sense an absolute temperature associated with the SoC, and generate first and second complementary-to-absolute-temperature (CTAT) voltages based on the sensed absolute temperature. The ADC has first and second input terminals that are coupled with the temperature sensor circuit, and configured to receive the first and second CTAT voltages, respectively. The ADC further has a reference terminal that is coupled with the temperature sensor circuit, and configured to receive the first and second CTAT voltages during first and second conversion cycles of the ADC, respectively, and an output terminal that is configured to generate first and second digital voltages during the first and second conversion cycles, respectively. The first digital voltage is generated based on the first CTAT voltage and a difference between the first and second CTAT voltages, and the second digital voltage is generated based on the second CTAT voltage and the difference between the first and second CTAT voltages. The digital processing circuit is coupled with the output terminal of the ADC, and configured to receive the first and second digital voltages during the first and second conversion cycles, respectively, and generate a temperature output voltage that is a digital representation of the sensed absolute temperature.

In another embodiment, a system-on-chip (SoC) is disclosed. The SoC includes a temperature-to-digital converter and a monitoring circuit. The temperature-to-digital converter includes a temperature sensor circuit, an ADC, and a digital processing circuit. The temperature sensor circuit is configured to sense an absolute temperature associated with the SoC, and generate first and second complementary-to-absolute-temperature (CTAT) voltages based on the sensed absolute temperature. The ADC has first and second input terminals that are coupled with the temperature sensor circuit, and configured to receive the first and second CTAT voltages, respectively. The ADC further has a reference terminal that is coupled with the temperature sensor circuit, and configured to receive the first and second CTAT voltages during first and second conversion cycles of the ADC, respectively, and an output terminal that is configured to generate first and second digital voltages during the first and second conversion cycles, respectively. The first digital voltage is generated based on the first CTAT voltage and a difference between the first and second CTAT voltages, and the second digital voltage is generated based on the second CTAT voltage and the difference between the first and second CTAT voltages. The digital processing circuit is coupled with the output terminal of the ADC, and configured to receive the first and second digital voltages during the first and second conversion cycles, respectively, and generate a temperature output voltage that is a digital representation of the sensed absolute temperature. The monitoring circuit is coupled with the temperature-to-digital converter, and configured to receive the temperature output voltage and generate a control signal to control an operation of the SoC. The control signal is activated when the temperature output voltage is greater than a threshold value.

In some examples, the temperature sensor circuit includes first and second current sources, and first and second transistors. The first and second current sources are configured to receive a supply voltage and generate first and second currents, respectively. The first transistor has base and collector terminals that are coupled with ground. The first transistor further has an emitter terminal that is coupled with the first current source, and configured to receive the first current and generate the first CTAT voltage. The second transistor has base and collector terminals that are coupled with ground. The second transistor further has an emitter terminal that is coupled with the second current source, and configured to receive the second current and generate the second CTAT voltage.

In some examples, the first current is greater than the second current. The first CTAT voltage is greater than the second CTAT voltage.

In some examples, the difference between the first and second CTAT voltages corresponds to a proportional-to-absolute-temperature voltage.

In some examples, the temperature-to-digital converter further includes first and second switches. The first switch is coupled with the temperature sensor circuit and the reference terminal of the ADC, and configured to receive a first clock signal and the first CTAT voltage, and provide the first CTAT voltage to the reference terminal of the ADC when the first clock signal is activated. The first clock signal is activated during the first conversion cycle. The second switch is coupled with the temperature sensor circuit and the reference terminal of the ADC, and configured to receive a second clock signal and the second CTAT voltage, and provide the second CTAT voltage to the reference terminal of the ADC when the second clock signal is activated. The second clock signal is activated during the second conversion cycle.

In some examples, the digital processing circuit comprises first and second correction circuits, first and second gain stages, and first and second subtractors. The first and second correction circuits are coupled with the output terminal of the ADC. The first correction circuit is configured to receive the first and second digital voltages during the first and second conversion cycles, respectively, and generate a first corrected voltage during the second conversion cycle. The second correction circuit is configured to receive the first and second digital voltages during the first and second conversion cycles, respectively, and generate a second corrected voltage during the second conversion cycle. The first and second corrected voltages are independent of a gain of the ADC. The first and second gain stages are coupled with the first and second correction circuits, respectively, and configured to receive the first and second corrected voltages and generate first and second amplified voltages, respectively. The first and second amplified voltages are amplified versions of the first and second corrected voltages, respectively. The first and second subtractors are coupled with the first and second gain stages, respectively. The first subtractor is configured to receive the first amplified voltage and a first reference voltage, and generate a first subtracted voltage, and the second subtractor is configured to receive the second amplified voltage and a second reference voltage, and generate a second subtracted voltage. The first subtracted voltage is equal to a difference between the first amplified voltage and the first reference voltage, and the second subtracted voltage is equal to a difference between the second amplified voltage and the second reference voltage.

In some examples, the digital processing circuit further comprises third and fourth switches. The third switch is coupled with the output terminal of the ADC and the first and second correction circuits, and configured to receive a first clock signal and the first digital voltage, and provide the first digital voltage to the first and second correction circuits when the first clock signal is activated. The first clock signal is activated during the first conversion cycle. The fourth switch is coupled with the output terminal of the ADC and the first and second correction circuits, and configured to receive a second clock signal and the second digital voltage, and provide the second digital voltage to the first and second correction circuits when the second clock signal is activated. The second clock signal is activated during the second conversion cycle.

In some examples, the digital processing circuit further comprises an averaging circuit that is coupled with the first and second subtractors, and configured to receive the first and second subtracted voltages, and generate the temperature output voltage. The temperature output voltage is an average of the first and second subtracted voltages.

In some examples, the averaging circuit comprises an adder and a third gain stage. The adder is coupled with the first and second subtractors, and configured to receive the first and second subtracted voltages, and generate an added voltage. The added voltage is equal to a sum of the first and second subtracted voltages. The third gain stage is coupled with the adder, and configured to receive the added voltage and generate the temperature output voltage. The temperature output voltage is an amplified version of the added voltage.

In some examples, the digital processing circuit comprises a third correction circuit, a fourth gain stage, and a third subtractor. The third correction circuit is coupled with the output terminal of the ADC, and configured to receive the first and second digital voltages during the first and second conversion cycles, respectively, and generate a third corrected voltage during the second conversion cycle. The third corrected voltage is independent of a gain of the ADC. The fourth gain stage is coupled with the third correction circuit, and configured to receive the third corrected voltage and generate a third amplified voltage. The third amplified voltage is an amplified version of the third corrected voltage. The third subtractor is coupled with the fourth gain stage, and configured to receive the third amplified voltage and a third reference voltage, and generate the temperature output voltage. The temperature output voltage is equal to a difference between the third amplified voltage and the third reference voltage.

In some examples, the operation of the SoC is controlled such that the SoC is one of reset and powered-off when the control signal is activated.

Various embodiments of the present disclosure disclose a temperature-to-digital converter. The temperature-to-digital converter includes a temperature sensor circuit, an ADC, and a digital processing circuit. The temperature sensor circuit is configured to generate first and second CTAT voltages based on an absolute temperature sensed by the temperature sensor circuit. The ADC is configured to receive the first and second CTAT voltages such that a resultant input voltage of the ADC is a difference between the first and second CTAT voltages. The ADC is further configured to receive, as a reference signal during first and second conversion cycles of the ADC, the first and second CTAT voltages generated by the temperature sensor circuit, respectively, and generate first and second digital voltages during the first and second conversion cycles, respectively. The first digital voltage is generated based on the first CTAT voltage and the difference between the first and second CTAT voltages, and the second digital voltage is generated based on the second CTAT voltage and the difference between the first and second CTAT voltages. The digital processing circuit is configured to receive the first and second digital voltages during the first and second conversion cycles, respectively, and generate a temperature output voltage that is a digital representation of the sensed absolute temperature. The generated temperature output voltage is independent of a gain of the ADC.

As the ADC receives the first and second CTAT voltages generated by the temperature sensor circuit as the reference signal during the first and second conversion cycles, respectively, the temperature-to-digital converter is a self-referenced temperature-to-digital converter. Thus, a requirement of an external reference signal generator (e.g., a bandgap circuit) to generate a reference signal for the ADC is eliminated. Further, due to utilization of the first and second CTAT voltages by the ADC as the reference signal to generate the first and second digital voltages during the first and second conversion cycles, respectively, the temperature output voltage generated by the temperature-to-digital converter is independent of the gain of the ADC. As the temperature output voltage is independent of the gain of the ADC, an ADC gain error that is typically introduced due to variations in the gain of the ADC is absent in the temperature output voltage. Thus, the elimination of the requirement of the external reference signal generator and the absence of the ADC gain error ensures that an accuracy of the temperature-to-digital converter of the present disclosure is improved significantly as compared to conventional temperature-to-digital converters.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
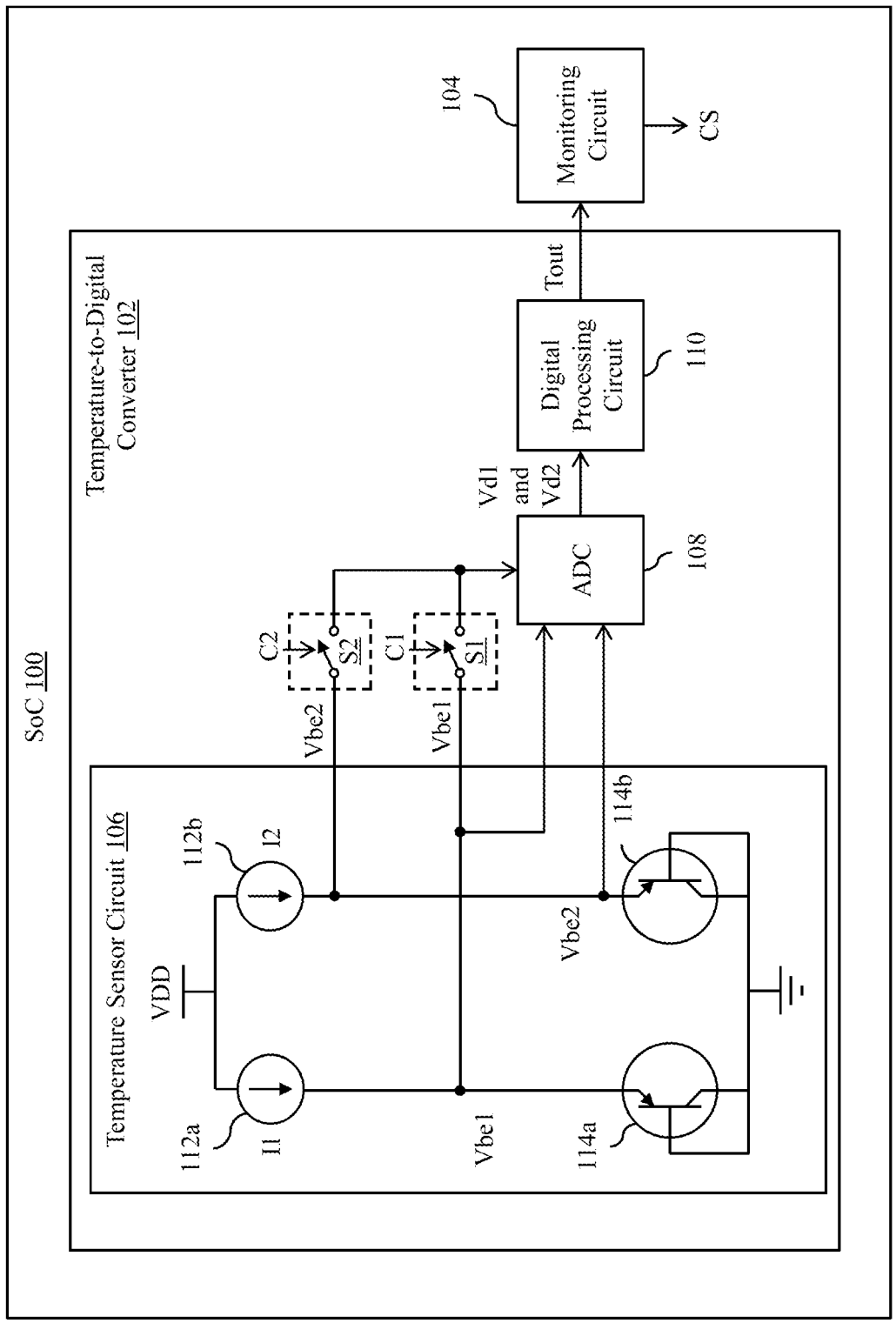
FIG. 1 is a block diagram of a system-on-chip (SoC) in accordance with an embodiment of the present disclosure.

FIG. 1 is a block diagram of a system-on-chip (SoC) 100 in accordance with an embodiment of the present disclosure. The SoC 100 includes a temperature-to-digital converter 102 and a monitoring circuit 104.

The temperature-to-digital converter 102 is configured to sense an absolute temperature associated with the SoC 100. In one example, the temperature-to-digital converter 102 senses an absolute temperature of a region of the SoC 100 where the temperature-to-digital converter 102 is located. Based on the sensed absolute temperature, the temperature-to-digital converter 102 is further configured to generate a temperature output voltage Tout such that the temperature output voltage Tout is a digital representation of the sensed absolute temperature. In one example, the temperature output voltage Tout represents the sensed absolute temperature in degree Celsius (i.e., ° C.). In another example, the temperature output voltage Tout represents the sensed absolute temperature in degree Fahrenheit (i.e., ° F.).

Although in the current embodiment, the SoC 100 includes a single temperature-to-digital converter (i.e., the temperature-to-digital converter 102), it will be apparent to a person skilled in the art that the scope of the present disclosure is not limited to it. In various other embodiments, the SoC 100 may include more than one temperature-to-digital converters at different locations on the SoC 100 to sense absolute temperatures of the corresponding locations, without deviating from the scope of the present disclosure.

The monitoring circuit 104 is coupled with the temperature-to-digital converter 102, and configured to receive the temperature output voltage Tout. The monitoring circuit 104 is further configured to compare the temperature output voltage Tout with a threshold value. The threshold value is a pre-determined value that may be determined based on cutoff temperatures associated with the SoC 100. Based on the comparison of the temperature output voltage Tout with the threshold value, the monitoring circuit 104 is further configured to generate a control signal CS to control an operation of the SoC 100. The control signal CS is deactivated (i.e., generated at logic low state) when the temperature output voltage Tout is less than or equal to the threshold value, and activated (i.e., generated at logic high state) when the temperature output voltage Tout is greater than the threshold value. Further, the monitoring circuit 104 may be configured to provide the control signal CS to a reset controller (not shown) of the SoC 100. Based on the control signal CS, the reset controller may be configured to reset or power-off the SoC 100. For example, the SoC 100 is reset or powered-off when the control signal CS is activated.

The temperature-to-digital converter 102 includes a temperature sensor circuit 106, an analog-to-digital converter (ADC) 108, first and second switches S1 and S2, and a digital processing circuit 110. The temperature-to-digital converter 102 may further include a clock generator circuit (not shown).

The clock generator circuit is configured to generate an input clock signal (shown later in FIG. 2). In the presently preferred embodiment, the clock generator circuit is further configured to generate first and second clock signals C1 and C2. In one example, the first and second clock signals C1 and C2 are derived from the input clock signal by altering the phase of the input clock signal differently for each of the first and second clock signals C1 and C2. A first cycle of the input clock signal corresponds to a first conversion cycle of the ADC 108, and a second cycle of the input clock signal corresponds to a second conversion cycle of the ADC 108. The first clock signal C1 is activated (i.e., generated at logic high state) during the first conversion cycle, and deactivated (i.e., generated at logic low state) during the second conversion cycle. The second clock signal C2 is activated during the second conversion cycle, and deactivated during the first conversion cycle.

The temperature sensor circuit 106 is configured to sense the absolute temperature associated with the SoC 100 and generate first and second complementary-to-absolute-temperature (CTAT) voltages Vbe1 and Vbe2 based on the sensed absolute temperature. The temperature sensor circuit 106 includes first and second current sources 112a and 112b, and first and second transistors 114a and 114b.

The first and second current sources 112a and 112b are configured to receive a supply voltage VDD and generate first and second currents I1 and I2, respectively. The first current I1 is greater than the second current I2. In one example, the first current I1 is five times of the second current I2. The first and second current sources 112a and 112b respectively bias the first and second transistors 114a and 114b.

The first and second transistors 114a and 114b are PNP bipolar junction transistors (BJTs). The first transistor 114a has base and collector terminals that are coupled with ground. The first transistor 114a further has an emitter terminal that is coupled with the first current source 112a, and configured to receive the first current I1 and generate the first CTAT voltage Vbe1. The second transistor 114b has base and collector terminals that are coupled with ground. The second transistor 114b further has an emitter terminal that is coupled with the second current source 112b, and configured to receive the second current I2 and generate the second CTAT voltage Vbe2. Since the first current I1 is greater than the second current I2, the first CTAT voltage Vbe1 is greater than the second CTAT voltage Vbe2. A difference between the first and second CTAT voltages Vbe1 and Vbe2 (i.e., Vbe1−Vbe2) corresponds to a proportional-to-absolute-temperature voltage.

It will be apparent to a person skilled in the art that the scope of the present disclosure is not limited to the first and second transistors 114a and 114b being PNP BJTs. In various other embodiments, the first and second transistors 114a and 114b may be NPN BJTs, without deviating from the scope of the present disclosure.

Although in the current embodiment, the first and second transistors 114a and 114b are PNP BJTs, each of which includes a base (i.e., a control terminal), a collector (i.e., a first current conducting terminal), and an emitter (i.e., a second current conducting terminal), it will be apparent to a person skilled in the art that the scope of the present disclosure is not limited to it. In various other embodiments, the first and second transistors 114a and 114b may be metal-oxide semiconductor field-effect transistors (MOSFETs), without deviating from the scope of the present disclosure. Accordingly, references herein to a "base", a "collector", and an "emitter" are not intended to be limiting, as each of these designations has an analogous feature for a MOSFET implementation (e.g., a "gate", a "drain", and a "source", respectively).

The ADC 108 has first and second input terminals that are coupled with the temperature sensor circuit 106 (i.e., the emitter terminals of the first and second transistors 114a and 114b), and configured to receive the first and second CTAT voltages Vbe1 and Vbe2, respectively. The first input terminal of the ADC 108 is a non-inverting input terminal and the second input terminal of the ADC 108 is an inverting input terminal. Thus, a resultant input received by the ADC 108 is the difference between the first and second CTAT voltages Vbe1 and Vbe2. The ADC 108 further has a reference terminal that is coupled with the temperature sensor circuit 106, and configured to receive the first and second CTAT voltages Vbe1 and Vbe2 during the first and second conversion cycles of the ADC 108, respectively. Thus, during the first conversion cycle, the ADC 108 receives the first CTAT voltage Vbe1 as a reference signal, and during the second conversion cycle, the ADC 108 receives the second CTAT voltage Vbe2 as the reference signal.

The ADC 108 further has an output terminal that is configured to generate first and second digital voltages Vd1 and Vd2 during the first and second conversion cycles, respectively. The first digital voltage Vd1 is generated based on the first CTAT voltage Vbe1 and the difference between the first and second CTAT voltages Vbe1 and Vbe2, and the second digital voltage Vd2 is generated based on the second CTAT voltage Vbe2 and the difference between the first and second CTAT voltages Vbe1 and Vbe2. In one example, the first and second digital voltages Vd1 and Vd2 are generated based on equations (1) and (2) given below:

$$Vd1 = \frac{g * Vbe1}{\Delta Vbe} \quad (1)$$

$$Vd2 = \frac{g * Vbe2}{\Delta Vbe} \quad (2)$$

where,
g represents a gain of the ADC 108, and
ΔVbe represents the difference between the first and second CTAT voltages Vbe1 and Vbe2.

Thus, the first and second digital voltages Vd1 and Vd2 are generated based on the gain of the ADC 108. Examples of the ADC 108 include, but are not limited to, a sigma-delta ADC, a sub-ranging ADC, a pipeline ADC, a flash ADC, and the like. The working of the ADC 108 is explained in detail in conjunction with FIG. 2.

The first switch S1 is coupled with the clock generator circuit and the temperature sensor circuit 106, and configured to receive the first clock signal C1 and the first CTAT voltage Vbe1. Further, the first switch S1 is coupled with the reference terminal of the ADC 108, and configured to provide the first CTAT voltage Vbe1 to the reference terminal of the ADC 108 when the first clock signal C1 is activated. The second switch S2 is coupled with the clock generator circuit and the temperature sensor circuit 106, and configured to receive the second clock signal C2 and the second CTAT voltage Vbe2. Further, the second switch S2 is coupled with the reference terminal of the ADC 108, and configured to provide the second CTAT voltage Vbe2 to the reference terminal of the ADC 108 when the second clock signal C2 is activated. In one embodiment, each of the first and second switches S1 and S2 is an n-channel metal oxide semiconductor transistor. In such a scenario, the activated states of the first and second clock signals C1 and C2 correspond to logic high states. In another embodiment, each of the first and second switches S1 and S2 is a p-channel metal oxide semiconductor transistor. In such a scenario, the activated states of the first and second clock signals C1 and C2 correspond to logic low states.

The digital processing circuit 110 is coupled with the output terminal of the ADC 108, and configured to receive the first and second digital voltages Vd1 and Vd2 during the first and second conversion cycles, respectively. The digital processing circuit 110 is further coupled with the monitoring circuit 104, and further configured to generate and provide the temperature output voltage Tout to the monitoring circuit 104. The structure and working of the digital processing circuit 110 are explained in detail in conjunction with FIGS. 3 and 4.

Figure 2:
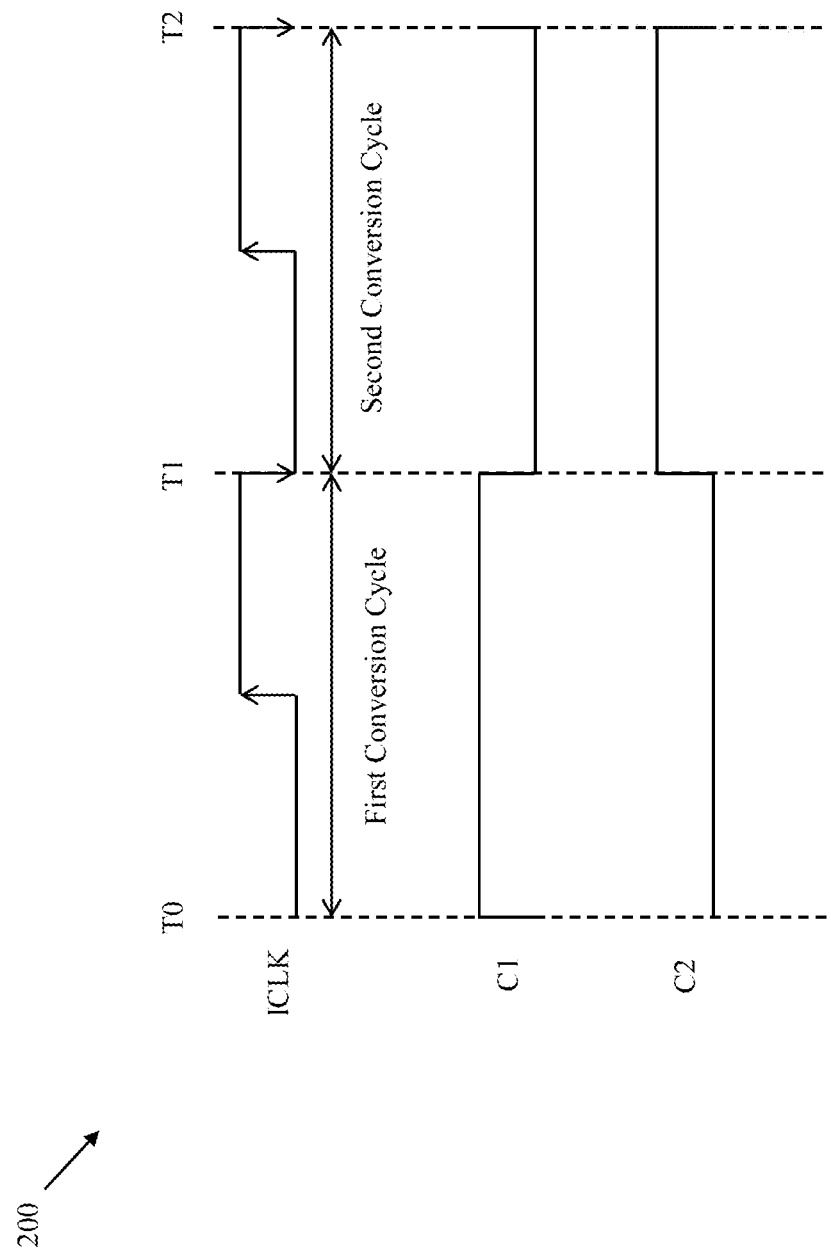
FIG. 2 is a timing diagram that illustrates an operation of an analog-to-digital converter (ADC) of the SoC of FIG. 1 in accordance with an embodiment of the present disclosure.

FIG. 2 is a timing diagram 200 that illustrates an operation of the ADC 108 in accordance with an embodiment of the present disclosure. The first cycle of the input clock signal (hereinafter referred to and designated as the "input clock signal ICLK") corresponds to the first conversion cycle of the ADC 108, and the second cycle of the input clock signal ICLK corresponds to the second conversion cycle of the ADC 108.

At time instance T0, the first clock signal C1 transitions from logic low state to logic high state and the second clock signal C2 is at logic low state. Thus, the first switch S1 is activated and the second switch S2 is deactivated. During time period T0-T1 (i.e., during the first conversion cycle), the first clock signal C1 remains at logic high state and the second clock signal C2 remains at logic low state. Thus, the first switch S1 remains activated and the second switch S2 remains deactivated. Hence, during time period T0-T1, as the first switch S1 is activated, the reference terminal of the ADC 108 receives the first CTAT voltage Vbe1, and the output terminal of the ADC 108 generates the first digital voltage Vd1.

At time instance T1, the first clock signal C1 transitions from logic high state to logic low state and the second clock signal C2 transitions from logic low state to logic high state. Thus, the first switch S1 is deactivated and the second switch S2 is activated. During time period T1-T2 (i.e., during the second conversion cycle), the first clock signal C1 remains at logic low state and the second clock signal C2 remains at logic high state. Thus, the first switch S1 remains deactivated and the second switch S2 remains activated. Hence, during time period T1-T2, as the second switch S2 is activated, the reference terminal of the ADC 108 receives the second CTAT voltage Vbe2, and the output terminal of the ADC 108 generates the second digital voltage Vd2. Further, the digital processing circuit 110 generates the temperature output voltage Tout based on the first and second digital voltages Vd1 and Vd2. It will be understood by a person skilled in the art that for the subsequent cycles of the input clock signal ICLK, and in turn for the subsequent cycles of the first and second clock signals C1 and C2, the ADC 108 operates in a manner similar to the operation of the ADC 108 during time period T0-T2.

Figure 3:
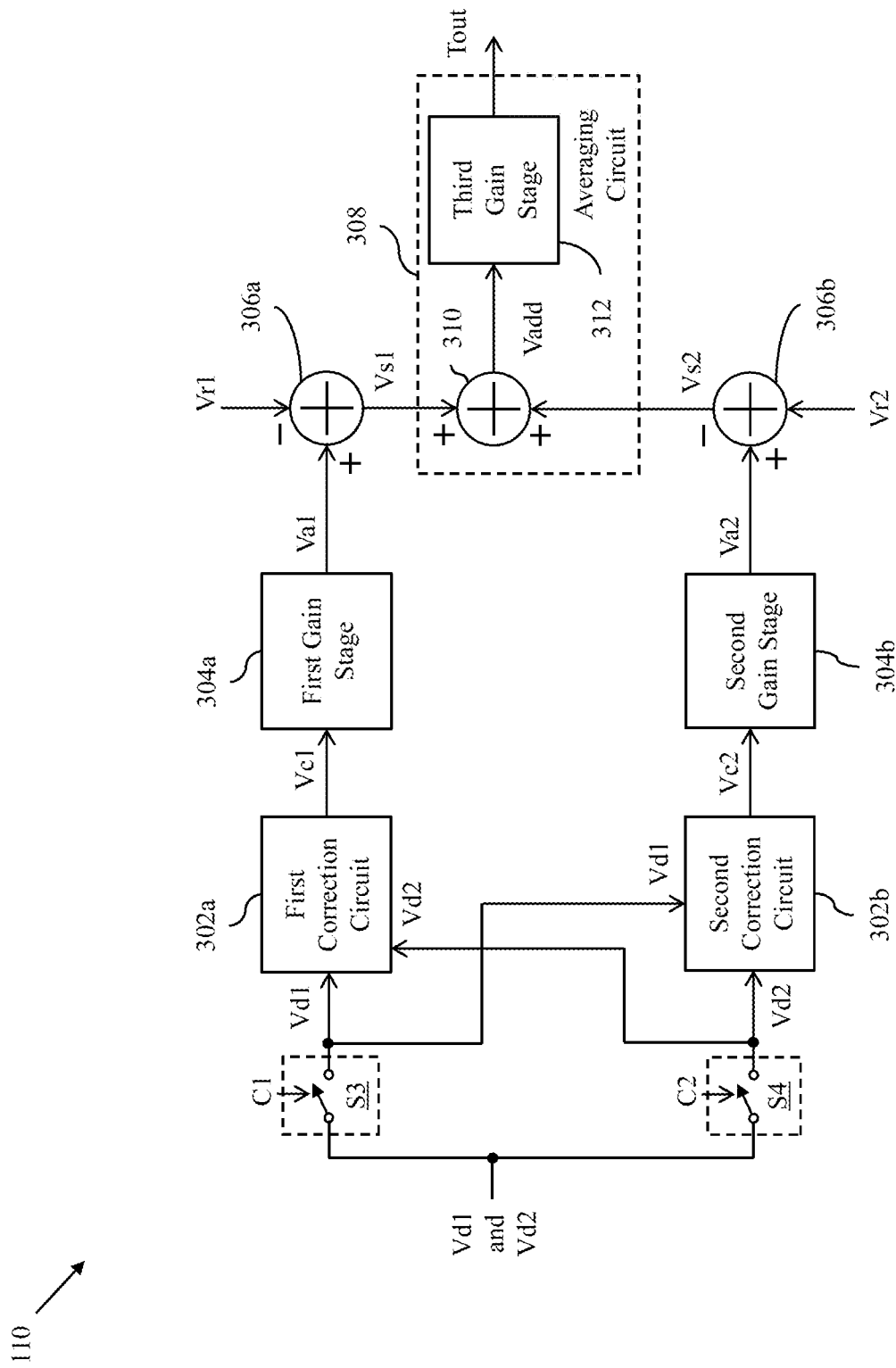
FIG. 3 is a block diagram of a digital processing circuit of the SoC of FIG. 1 in accordance with an embodiment of the present disclosure.

FIG. 3 is a block diagram of the digital processing circuit 110 in accordance with an embodiment of the present disclosure. As illustrated in FIG. 3, the digital processing circuit 110 includes third and fourth switches S3 and S4, first and second correction circuits 302a and 302b, first and second gain stages 304a and 304b, first and second subtractors 306a and 306b, and an averaging circuit 308.

The third switch S3 is coupled with the clock generator circuit and the output terminal of the ADC 108, and configured to receive the first clock signal C1 and the first digital voltage Vd1. Further, the third switch S3 is coupled with the first and second correction circuits 302a and 302b, and configured to provide the first digital voltage Vd1 to the first and second correction circuits 302a and 302b when the first clock signal C1 is activated. The fourth switch S4 is coupled with the clock generator circuit and the output terminal of the ADC 108, and configured to receive the second clock signal C2 and the second digital voltage Vd2. Further, the fourth switch S4 is coupled with the first and second correction circuits 302a and 302b, and configured to provide the second digital voltage Vd2 to the first and second correction circuits 302a and 302b when the second clock signal C2 is activated. In one embodiment, each of the third and fourth switches S3 and S4 is an n-channel metal oxide semiconductor transistor. In such a scenario, the activated states of the first and second clock signals C1 and C2 correspond to logic high states. In another embodiment, each of the third and fourth switches S3 and S4 is a p-channel metal oxide semiconductor transistor. In such a scenario, the activated states of the first and second clock signals C1 and C2 correspond to logic low states.

The first and second correction circuits 302a and 302b are coupled with the output terminal of the ADC 108 by way of the third and fourth switches S3 and S4, respectively. The first correction circuit 302a is configured to receive, by way of the third and fourth switched S3 and S4, the first and second digital voltages Vd1 and Vd2 during the first and second conversion cycles, respectively, and generate a first corrected voltage Vc1 during the second conversion cycle. To generate the first corrected voltage Vc1, the first correction circuit 302a is further configured to execute a first arithmetic operation on the first and second digital voltages Vd1 and Vd2 to generate a first intermediate voltage (not shown). The first arithmetic operation is represented by an equation (3) given below:

$$Vi1 = \frac{Vd1}{Vd1 - Vd2} \quad (3)$$

where,
Vi1 represents the first intermediate voltage.

Simplifying the equation (3) based on the equations (1) and (2), the first intermediate voltage may be represented by equation (4) given below:

$$Vi1 = \frac{Vbe1}{\Delta Vbe} \quad (4)$$

Equation (4) thus indicates that the first intermediate voltage is independent of the gain of the ADC 108 (i.e., g).

The first correction circuit 302a is then further configured to execute a second arithmetic operation on the first intermediate voltage to generate the first corrected voltage Vc1. The second arithmetic operation is represented by an equation (5) given below:

$$Vc1 = \frac{\alpha 1}{\alpha 1 + Vi1} \quad (5)$$

where,
α1 represents a first pre-defined constant value.

Similarly, the second correction circuit 302b is configured to receive, by way of the third and fourth switched S3 and S4, the first and second digital voltages Vd1 and Vd2 during the first and second conversion cycles, respectively, and generate a second corrected voltage Vc2 during the second conversion cycle. To generate the second corrected voltage Vc2, the second correction circuit 302b is further configured to execute a third arithmetic operation on the first and second digital voltages Vd1 and Vd2 to generate a second intermediate voltage (not shown). The third arithmetic operation is represented by an equation (6) given below:

$$Vi2 = \frac{Vd2}{Vd1 - Vd2} \quad (6)$$

where,
Vi2 represents the second intermediate voltage.

Simplifying the equation (6) based on the equations (1) and (2), the second intermediate voltage may be represented by equation (7) given below:

$$Vi2 = \frac{Vbe2}{\Delta Vbe} \quad (7)$$

Equation (7) thus indicates that the second intermediate voltage is independent of the gain of the ADC 108 (i.e., g).

The second correction circuit 302b is then further configured to execute a fourth arithmetic operation on the second intermediate voltage to generate the second corrected voltage Vc2. The fourth arithmetic operation is represented by an equation (8) given below:

$$Vc2 = \frac{\alpha 2}{\alpha 2 + Vi2} \quad (8)$$

where,
α2 represents a second pre-defined constant value.

The arithmetic operations executed by the first and second correction circuits 302a and 302b to generate the first and second corrected voltages Vc1 and Vc2, respectively, ensure that the first and second corrected voltages Vc1 and Vc2 are independent of the gain of the ADC 108 and represent the absolute temperature. It will be apparent to a person skilled in the art that the first and second corrected voltages Vc1 and Vc2 and the first and second intermediate voltages Vi1 and Vi2 are digital representations of corresponding voltages implemented by utilizing digital circuitry.

The first and second gain stages 304a and 304b are coupled with the first and second correction circuits 302a and 302b, respectively, and configured to receive the first and second corrected voltages Vc1 and Vc2, respectively. The first and second gain stages 304a and 304b are further configured to generate first and second amplified voltages Va1 and Va2, respectively. The first amplified voltage Va1 is an amplified version of the first corrected voltage Vc1 and the second amplified voltage Va2 is an amplified version of the second corrected voltage Vc2.

The first and second subtractors 306a and 306b are coupled with the first and second gain stages 304a and 304b, respectively. The first subtractor 306a is configured to receive the first amplified voltage Va1 and a first reference voltage Vr1, and generate a first subtracted voltage Vs1 such that the first subtracted voltage Vs1 is equal to a difference between the first amplified voltage Va1 and the first reference voltage Vr1. The second subtractor 306b is configured to receive the second amplified voltage Va2 and a second reference voltage Vr2, and generate a second subtracted voltage Vs2 such that the second subtracted voltage Vs2 is equal to a difference between the second amplified voltage Va2 and the second reference voltage Vr2. The first and second reference voltages Vr1 and Vr2 are digital constants at first and second pre-determined voltage levels, respectively. Based on the first and second reference voltages Vr1 and Vr2, the first and second subtracted voltages Vs1 and Vs2 represent the sensed absolute temperature in degree Celsius. It will be apparent to a person skilled in the art that the first and second amplified voltages Va1 and Va2, the first and second reference voltages Vr1 and Vr2, and the first and second subtracted voltages Vs1 and Vs2 are digital representations of corresponding voltages implemented by utilizing digital circuitry.

The averaging circuit 308 is coupled with the first and second subtractors 306a and 306b, and configured to receive the first and second subtracted voltages Vs1 and Vs2, and generate the temperature output voltage Tout. In one embodiment, the temperature output voltage Tout is an average of the first and second subtracted voltages Vs1 and Vs2. The averaging circuit 308 includes an adder 310 and a third gain stage 312.

The adder 310 is coupled with the first and second subtractors 306a and 306b, and configured to receive the first and second subtracted voltages Vs1 and Vs2, and generate an added voltage Vadd. The added voltage Vadd is equal to a sum of the first and second subtracted voltages Vs1 and Vs2. The third gain stage 312 is coupled with the adder 310, and configured to receive the added voltage Vadd and generate the temperature output voltage Tout. The temperature output voltage Tout is an amplified version of the added voltage Vadd. It will be apparent to a person skilled in the art that the added voltage Vadd and the temperature output voltage Tout are digital representations of corresponding voltages implemented by utilizing digital circuitry.

As the temperature output voltage Tout is generated by averaging the first and second subtracted voltages Vs1 and Vs2, a noise power associated with the temperature-to-digital converter 102 is reduced by half as compared to a noise power associated with a conventional temperature-to-digital converter.

Figure 4:
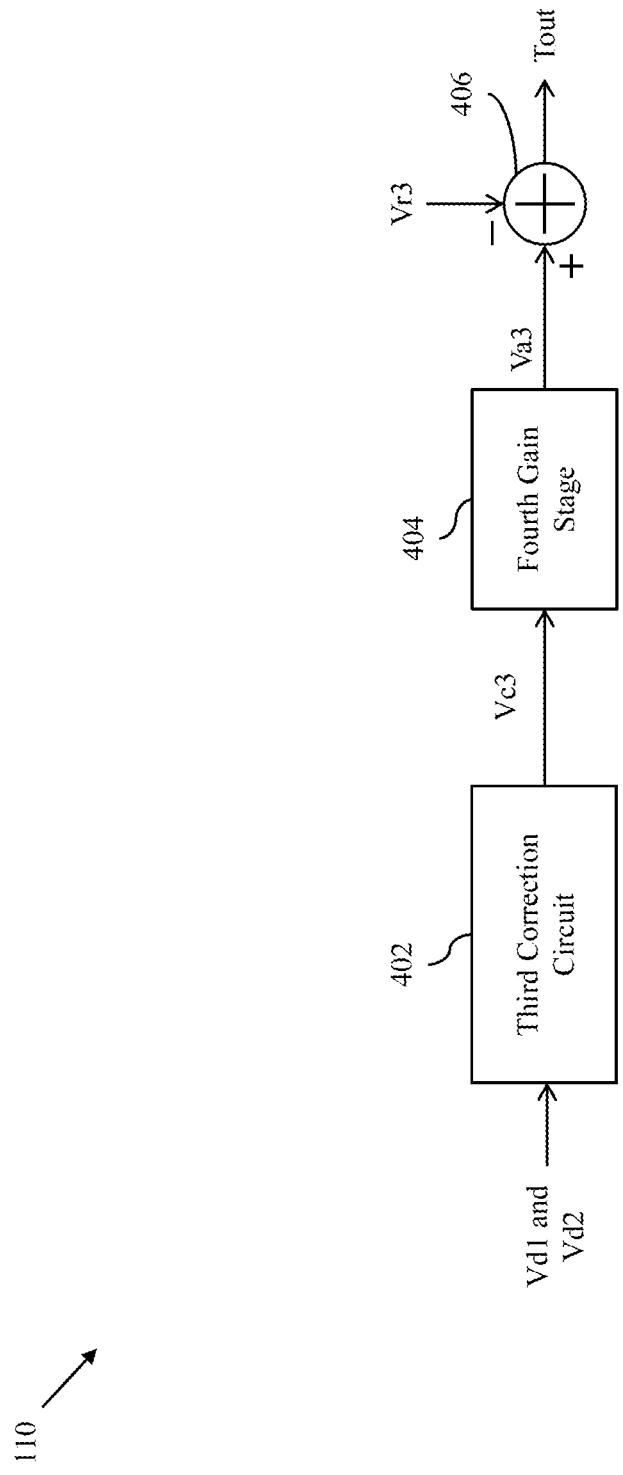
FIG. 4 is a block diagram of the digital processing circuit of the SoC of FIG. 1 in accordance with another embodiment of the present disclosure.

FIG. 4 is a block diagram of the digital processing circuit 110 in accordance with another embodiment of the present disclosure. As illustrated in FIG. 4, the digital processing circuit 110 includes a third correction circuit 402, a fourth gain stage 404, and a third subtractor 406.

The third correction circuit 402 is coupled with the output terminal of the ADC 108, and configured to receive the first and second digital voltages Vd1 and Vd2 during the first and second conversion cycles, respectively. The third correction circuit 402 may include a buffer memory (not shown) that stores the first digital voltage Vd1 received during the first conversion cycle. Further, the third correction circuit 402 is configured to generate a third corrected voltage Vc3 during the second conversion cycle based on the first and second digital voltages Vd1 and Vd2. To generate the third corrected voltage Vc3, the third correction circuit 402 is further configured to execute a fifth arithmetic operation on the first and second digital voltages Vd1 and Vd2 to generate a third intermediate voltage (not shown). The fifth arithmetic operation is represented by an equation (9) given below:

$$Vi3 = \frac{Vd1}{Vd1 - Vd2} \quad (9)$$

where,
Vi3 represents the third intermediate voltage.

Simplifying the equation (9) based on the equations (1) and (2), the third PG intermediate voltage may be represented by equation (10) given below:

$$Vi3 = \frac{Vbe1}{\Delta Vbe} \quad (10)$$

The third correction circuit 402 is then further configured to execute a sixth arithmetic operation on the third intermediate voltage to generate the third corrected voltage Vc3. The sixth arithmetic operation is represented by an equation (11) given below:

$$Vc3 = \frac{\alpha 3}{\alpha 3 + Vi3} \quad (11)$$

where,
α3 represents a third pre-defined constant value.

The arithmetic operations executed by the third correction circuit 402 to generate the third corrected voltage Vc3 ensure that the third corrected voltage Vc3 is independent of the gain of the ADC 108 and represents the absolute temperature. It will be apparent to a person skilled in the art that the third corrected voltage Vc3 and the third intermediate voltages Vi3 are digital representations of corresponding voltages implemented by utilizing digital circuitry.

The fourth gain stage 404 is coupled with the third correction circuit 402, and configured to receive the third corrected voltage Vc3 and generate a third amplified voltage Va3. The third amplified voltage Va3 is an amplified version of the third corrected voltage Vc3.

The third subtractor 406 is coupled with the fourth gain stage 404, and configured to receive the third amplified voltage Va3 and a third reference voltage Vr3, and generate the temperature output voltage Tout such that the temperature output voltage Tout is equal to a difference between the third amplified voltage Va3 and the third reference voltage Vr3. The third reference voltage Vr3 is a digital constant at a third pre-determined voltage level. Based on the third reference voltage Vr3, the temperature output voltage Tout represents the sensed temperature in degree Celsius. It will be apparent to a person skilled in the art that the third amplified voltage Va3 and the third reference voltage Vr3 are digital representations of corresponding voltages implemented by utilizing digital circuitry.

As the ADC 108 receives the first and second CTAT voltages Vbe1 and Vbe2 generated by the temperature sensor circuit 106 as the reference signal during the first and second conversion cycles, respectively, the temperature-to-digital converter 102 is a self-referenced temperature-to-digital converter. Thus, a requirement of an external reference signal generator (e.g., a bandgap circuit) to generate a reference signal for the ADC 108 is eliminated. Further, due to utilization of the first and second CTAT voltages Vbe1 and Vbe2 as the reference signal to generate the first and second digital voltages Vd1 and Vd2 during the first and second conversion cycles, respectively, the temperature output voltage Tout generated by the temperature-to-digital converter 102 is independent of the gain of the ADC 108. As the temperature output voltage Tout is independent of the gain of the ADC 108, an ADC gain error due that is typically introduced due to variations in the gain of the ADC 108 is absent in the temperature output voltage Tout. Thus, the elimination of the requirement of the external reference signal generator and the absence of the ADC gain error ensures that an accuracy of the temperature-to-digital converter 102 is significantly higher as compared to the conventional temperature-to-digital converter.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims.

The invention claimed is:

1. A temperature-to-digital converter of a system-on-chip (SoC), comprising:
   a temperature sensor circuit that is configured to sense an absolute temperature associated with the SoC, and generate first and second complementary-to-absolute-temperature (CTAT) voltages based on the sensed absolute temperature;
   an analog-to-digital converter (ADC) that has:
      first and second input terminals coupled with the temperature sensor circuit, and configured to receive the first and second CTAT voltages, respectively;
      a reference terminal coupled with the temperature sensor circuit, and configured to receive the first and second CTAT voltages during first and second conversion cycles of the ADC, respectively; and
      an output terminal configured to generate first and second digital voltages during the first and second conversion cycles, respectively, wherein the first digital voltage is generated based on the first CTAT voltage and a difference between the first and second CTAT voltages, and the second digital voltage is generated based on the second CTAT voltage and the difference between the first and second CTAT voltages; and
   a digital processing circuit that is coupled with the output terminal of the ADC, and configured to receive the first and second digital voltages during the first and second conversion cycles, respectively, and generate a temperature output voltage that is a digital representation of the sensed absolute temperature.

2. The temperature-to-digital converter of claim 1, wherein the difference between the first and second CTAT voltages corresponds to a proportional-to-absolute-temperature voltage.

3. The temperature-to-digital converter of claim 1, further comprising:
   a first switch that is coupled with the temperature sensor circuit and the reference terminal of the ADC, and configured to receive a first clock signal and the first CTAT voltage, and provide the first CTAT voltage to the reference terminal of the ADC when the first clock signal is activated, wherein the first clock signal is activated during the first conversion cycle; and
   a second switch that is coupled with the temperature sensor circuit and the reference terminal of the ADC, and configured to receive a second clock signal and the second CTAT voltage, and provide the second CTAT voltage to the reference terminal of the ADC when the second clock signal is activated, wherein the second clock signal is activated during the second conversion cycle.

4. The temperature-to-digital converter of claim 1, wherein the digital processing circuit comprises:
   a third correction circuit that is coupled with the output terminal of the ADC, and configured to receive the first and second digital voltages during the first and second conversion cycles, respectively, and generate a third corrected voltage during the second conversion cycle, wherein the third corrected voltage is independent of a gain of the ADC;
   a fourth gain stage that is coupled with the third correction circuit, and configured to receive the third corrected voltage and generate a third amplified voltage, wherein the third amplified voltage is an amplified version of the third corrected voltage; and
   a third subtractor that is coupled with the fourth gain stage, and configured to receive the third amplified voltage and a third reference voltage, and generate the temperature output voltage, wherein the temperature output voltage is equal to a difference between the third amplified voltage and the third reference voltage.

5. The temperature-to-digital converter of claim 1, wherein the temperature sensor circuit comprises:
   first and second current sources that are configured to receive a supply voltage and generate first and second currents, respectively;
   a first transistor that has: (i) base and collector terminals coupled with ground, and (ii) an emitter terminal coupled with the first current source, and configured to receive the first current and generate the first CTAT voltage; and
   a second transistor that has: (i) base and collector terminals coupled with ground, and (ii) an emitter terminal coupled with the second current source, and configured to receive the second current and generate the second CTAT voltage.

6. The temperature-to-digital converter of claim 5, wherein the first current is greater than the second current, and wherein the first CTAT voltage is greater than the second CTAT voltage.

7. The temperature-to-digital converter of claim 1, wherein the digital processing circuit comprises:
- first and second correction circuits that are coupled with the output terminal of the ADC, wherein the first correction circuit is configured to receive the first and second digital voltages during the first and second conversion cycles, respectively, and generate a first corrected voltage during the second conversion cycle, wherein the second correction circuit is configured to receive the first and second digital voltages during the first and second conversion cycles, respectively, and generate a second corrected voltage during the second conversion cycle, and wherein the first and second corrected voltages are independent of a gain of the ADC;
- first and second gain stages that are coupled with the first and second correction circuits, respectively, and configured to receive the first and second corrected voltages and generate first and second amplified voltages, respectively, wherein the first and second amplified voltages are amplified versions of the first and second corrected voltages, respectively; and
- first and second subtractors that are coupled with the first and second gain stages, respectively, wherein the first subtractor is configured to receive the first amplified voltage and a first reference voltage, and generate a first subtracted voltage, and the second subtractor is configured to receive the second amplified voltage and a second reference voltage, and generate a second subtracted voltage, and wherein the first subtracted voltage is equal to a difference between the first amplified voltage and the first reference voltage, and the second subtracted voltage is equal to a difference between the second amplified voltage and the second reference voltage.

8. The temperature-to-digital converter of claim 7, wherein the digital processing circuit further comprises:
- a third switch that is coupled with the output terminal of the ADC and the first and second correction circuits, and configured to receive a first clock signal and the first digital voltage, and provide the first digital voltage to the first and second correction circuits when the first clock signal is activated, wherein the first clock signal is activated during the first conversion cycle; and
- a fourth switch that is coupled with the output terminal of the ADC and the first and second correction circuits, and configured to receive a second clock signal and the second digital voltage, and provide the second digital voltage to the first and second correction circuits when the second clock signal is activated, wherein the second clock signal is activated during the second conversion cycle.

9. The temperature-to-digital converter of claim 7, wherein the digital processing circuit further comprises an averaging circuit that is coupled with the first and second subtractors, and configured to receive the first and second subtracted voltages, and generate the temperature output voltage, and wherein the temperature output voltage is an average of the first and second subtracted voltages.

10. The temperature-to-digital converter of claim 9, wherein the averaging circuit comprises:
- an adder that is coupled with the first and second subtractors, and configured to receive the first and second subtracted voltages, and generate an added voltage, wherein the added voltage is equal to a sum of the first and second subtracted voltages; and
- a third gain stage that is coupled with the adder, and configured to receive the added voltage and generate the temperature output voltage, wherein the temperature output voltage is an amplified version of the added voltage.

11. A system-on-chip (SoC), comprising:
a temperature-to-digital converter comprising:
- a temperature sensor circuit that is configured to sense an absolute temperature associated with the SoC, and generate first and second complementary-to-absolute-temperature (CTAT) voltages based on the sensed absolute temperature;
- an analog-to-digital converter (ADC) that has:
  - first and second input terminals coupled with the temperature sensor circuit, and configured to receive the first and second CTAT voltages, respectively;
  - a reference terminal coupled with the temperature sensor circuit, and configured to receive the first and second CTAT voltages during first and second conversion cycles of the ADC, respectively; and
  - an output terminal configured to generate first and second digital voltages during the first and second conversion cycles, respectively, wherein the first digital voltage is generated based on the first CTAT voltage and a difference between the first and second CTAT voltages, and the second digital voltage is generated based on the second CTAT voltage and the difference between the first and second CTAT voltages; and
- a digital processing circuit that is coupled with the output terminal of the ADC, and configured to receive the first and second digital voltages during the first and second conversion cycles, respectively, and generate a temperature output voltage that is a digital representation of the sensed absolute temperature; and
a monitoring circuit that is coupled with the temperature-to-digital converter, and configured to receive the temperature output voltage and generate a control signal to control an operation of the SoC, wherein the control signal is activated when the temperature output voltage is greater than a threshold value.

12. The SoC of claim 11, wherein the temperature sensor circuit comprises:
- first and second current sources that are configured to receive a supply voltage and generate first and second currents, respectively;
- a first transistor that has: (i) base and collector terminals coupled with ground, and (ii) an emitter terminal coupled with the first current source, and configured to receive the first current and generate the first CTAT voltage; and
- a second transistor that has: (i) base and collector terminals coupled with ground and (ii) an emitter terminal coupled with the second current source, and configured to receive the second current and generate the second CTAT voltage, wherein the first current is greater than the second current, and wherein the first CTAT voltage is greater than the second CTAT voltage.

13. The SoC of claim 11, wherein the operation of the SoC is controlled such that the SoC is one of reset and powered-off when the control signal is activated.

14. The SoC of claim 11, wherein the difference between the first and second CTAT voltages corresponds to a proportional-to-absolute-temperature voltage.

15. The SoC of claim 11, wherein the temperature-to-digital converter further comprises:
- a first switch that is coupled with the temperature sensor circuit and the reference terminal of the ADC, and configured to receive a first clock signal and the first CTAT voltage, and provide the first CTAT voltage to the reference terminal of the ADC when the first clock signal is activated, wherein the first clock signal is activated during the first conversion cycle; and
- a second switch that is coupled with the temperature sensor circuit and the reference terminal of the ADC, and configured to receive a second clock signal and the second CTAT voltage, and provide the second CTAT voltage to the reference terminal of the ADC when the second clock signal is activated, wherein the second clock signal is activated during the second conversion cycle.

16. The SoC of claim 11, wherein the digital processing circuit comprises:
- a third correction circuit that is coupled with the output terminal of the ADC, and configured to receive the first and second digital voltages during the first and second conversion cycles, respectively, and generate a third corrected voltage during the second conversion cycle, wherein the third corrected voltage is independent of a gain of the ADC;
- a fourth gain stage that is coupled with the third correction circuit, and configured to receive the third corrected voltage and generate a third amplified voltage, wherein the third amplified voltage is an amplified version of the third corrected voltage; and
- a third subtractor that is coupled with the fourth gain stage, and configured to receive the third amplified voltage and a third reference voltage, and generate the temperature output voltage, wherein the temperature output voltage is equal to a difference between the third amplified voltage and the third reference voltage.

17. The SoC of claim 11, wherein the digital processing circuit comprises:
- first and second correction circuits that are coupled with the output terminal of the ADC, wherein the first correction circuit is configured to receive the first and second digital voltages during the first and second conversion cycles, respectively, and generate a first corrected voltage during the second conversion cycle, wherein the second correction circuit is configured to receive the first and second digital voltages during the first and second conversion cycles, respectively, and generate a second corrected voltage during the second conversion cycle, and wherein the first and second corrected voltages are independent of a gain of the ADC;
- first and second gain stages that are coupled with the first and second correction circuits, respectively, and configured to receive the first and second corrected voltages and generate first and second amplified voltages, respectively, wherein the first and second amplified voltages are amplified versions of the first and second corrected voltages, respectively; and
- first and second subtractors that are coupled with the first and second gain stages, respectively, wherein the first subtractor is configured to receive the first amplified voltage and a first reference voltage, and generate a first subtracted voltage, and the second subtractor is configured to receive the second amplified voltage and a second reference voltage, and generate a second subtracted voltage, and wherein the first subtracted voltage is equal to a difference between the first amplified voltage and the first reference voltage, and the second subtracted voltage is equal to a difference between the second amplified voltage and the second reference voltage.

18. The SoC of claim 17, wherein the digital processing circuit further comprises:
- a third switch that is coupled with the output terminal of the ADC and the first and second correction circuits, and configured to receive a first clock signal and the first digital voltage, and provide the first digital voltage to the first and second correction circuits when the first clock signal is activated, wherein the first clock signal is activated during the first conversion cycle; and
- a fourth switch that is coupled with the output terminal of the ADC and the first and second correction circuits, and configured to receive a second clock signal and the second digital voltage, and provide the second digital voltage to the first and second correction circuits when the second clock signal is activated, wherein the second clock signal is activated during the second conversion cycle.

19. The SoC of claim 17, wherein the digital processing circuit further comprises an averaging circuit that is coupled with the first and second subtractors, and configured to receive the first and second subtracted voltages, and generate the temperature output voltage, and wherein the temperature output voltage is an average of the first and second subtracted voltages.

20. The SoC of claim 19, wherein the averaging circuit comprises:
- an adder that is coupled with the first and second subtractors, and configured to receive the first and second subtracted voltages, and generate an added voltage, wherein the added voltage is equal to a sum of the first and second subtracted voltages; and
- a third gain stage that is coupled with the adder, and configured to receive the added voltage and generate the temperature output voltage, wherein the temperature output voltage is an amplified version of the added voltage.

* * * * *